US011239350B2

(12) United States Patent
Takahashi

(10) Patent No.: US 11,239,350 B2
(45) Date of Patent: Feb. 1, 2022

(54) SEMICONDUCTOR DEVICE, METHOD OF MANUFACTURING SEMICONDUCTOR DEVICE, POWER CONVERSION DEVICE

(71) Applicant: Mitsubishi Electric Corporation, Tokyo (JP)

(72) Inventor: Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/596,950

(22) Filed: Oct. 9, 2019

(65) Prior Publication Data

US 2020/0044065 A1 Feb. 6, 2020

Related U.S. Application Data

(62) Division of application No. 15/951,262, filed on Apr. 12, 2018, now Pat. No. 10,505,027.

(30) Foreign Application Priority Data

Sep. 14, 2017 (JP) .................................. 2017-176838

(51) Int. Cl.
*H01L 29/739* (2006.01)
*H01L 29/78* (2006.01)
(Continued)

(52) U.S. Cl.
CPC ...... *H01L 29/7395* (2013.01); *H01L 29/0692* (2013.01); *H01L 29/0696* (2013.01);
(Continued)

(58) Field of Classification Search
CPC ............. H01L 29/7395; H01L 29/0878; H01L 29/407; H01L 29/0696; H01L 29/42376;
(Continued)

(56) References Cited

U.S. PATENT DOCUMENTS 6,551,881 B1 4/2003 Letavic
2004/0150377 A1 8/2004 Elek et al.
(Continued)

FOREIGN PATENT DOCUMENTS

DE 10 2014 119 543 A1 6/2016
JP 2005-340626 A 12/2005
(Continued)

OTHER PUBLICATIONS

An Office Action; "Notice of Reasons for Refusal," mailed by the Japanese Patent Office dated Sep. 8, 2020, which corresponds to Japanese Patent Application No. 2017-176838 and is related to U.S. Appl. No. 16/596,950 with English language translation.
(Continued)

*Primary Examiner* — Ahmed N Sefer
(74) *Attorney, Agent, or Firm* — Studebaker & Brackett PC

(57) ABSTRACT

A semiconductor device including a first conductivity type substrate, a first conductivity type carrier store layer formed on an upper surface side of the substrate, a second conductivity type channel dope layer formed on the carrier store layer, a first conductivity type emitter layer formed on the channel dope layer, a gate electrode in contact with the emitter layer, the channel dope layer and the carrier store layer via a gate insulating film, and a second conductivity type collector layer formed on a lower surface side of the substrate, wherein the gate insulating film has a first part in contact with the emitter layer and the channel dope layer, a second part in contact with the carrier store layer, and a third part in contact with the substrate, and at least a part of the second part is thicker than the first part and the third part.

4 Claims, 20 Drawing Sheets

(51) Int. Cl.
*H01L 29/06* (2006.01)
*H01L 29/423* (2006.01)
*H01L 29/10* (2006.01)
*H01L 29/40* (2006.01)
*H01L 29/08* (2006.01)

(52) U.S. Cl.
CPC ...... *H01L 29/0878* (2013.01); *H01L 29/1095* (2013.01); *H01L 29/407* (2013.01); *H01L 29/4236* (2013.01); *H01L 29/42368* (2013.01); *H01L 29/42376* (2013.01); *H01L 29/7394* (2013.01); *H01L 29/7397* (2013.01); *H01L 29/7813* (2013.01); *H01L 29/7827* (2013.01); *H01L 29/0653* (2013.01)

(58) Field of Classification Search
CPC ............. H01L 29/4236; H01L 29/7397; H01L 29/1095; H01L 29/42368; H01L 29/7813; H01L 29/0692; H01L 29/7827; H01L 29/7394; H01L 29/0653
See application file for complete search history.

(56) References Cited

U.S. PATENT DOCUMENTS

| | | | |
|---|---|---|---|
| 2005/0263852 A1 | 12/2005 | Ogura et al. | |
| 2006/0237786 A1* | 10/2006 | Ninomiya | H01L 29/7393 257/341 |
| 2007/0040213 A1 | 2/2007 | Hotta et al. | |
| 2009/0020852 A1* | 1/2009 | Harada | H01L 29/0696 257/579 |
| 2010/0078707 A1* | 4/2010 | Haeberlen | H01L 29/7805 257/328 |
| 2011/0136310 A1* | 6/2011 | Grivna | H01L 29/407 438/270 |
| 2011/0204439 A1 | 8/2011 | Kawaguchi | |
| 2012/0025874 A1* | 2/2012 | Saikaku | H01L 29/7397 327/109 |
| 2012/0056241 A1* | 3/2012 | Sumitomo | H01L 29/0619 257/139 |
| 2012/0146091 A1 | 6/2012 | Tanabe et al. | |
| 2013/0214348 A1 | 8/2013 | Takeda | |
| 2013/0248880 A1 | 9/2013 | Ariyoshi et al. | |
| 2014/0003109 A1* | 1/2014 | Shiraishi | H01L 29/407 363/131 |
| 2014/0042525 A1* | 2/2014 | Darwish | H01L 29/66734 257/329 |
| 2014/0073123 A1* | 3/2014 | Meiser | H01L 21/76877 438/586 |
| 2014/0077293 A1 | 3/2014 | Kitagawa | |
| 2014/0231866 A1 | 8/2014 | Senoo et al. | |
| 2015/0144995 A1* | 5/2015 | Takahashi | H01L 29/7397 257/139 |
| 2015/0279930 A1* | 10/2015 | Breymesser | H01L 29/66136 257/487 |
| 2016/0043205 A1 | 2/2016 | Kamata | |
| 2016/0190123 A1 | 6/2016 | Laven et al. | |
| 2016/0197143 A1 | 7/2016 | Naito | |
| 2016/0204238 A1* | 7/2016 | Tang | H01L 29/7397 257/139 |
| 2016/0336393 A1* | 11/2016 | Kim | H01L 29/0619 |
| 2017/0110572 A1* | 4/2017 | Zundel | H01L 29/0878 |
| 2017/0141216 A1 | 5/2017 | Abe et al. | |
| 2017/0186663 A1* | 6/2017 | Laven | H01L 23/3672 |
| 2017/0213908 A1* | 7/2017 | Fursin | H01L 29/0615 |
| 2018/0019331 A1 | 1/2018 | Sumitomo et al. | |
| 2018/0114788 A1* | 4/2018 | Ahlers | H01L 27/0292 |
| 2019/0006495 A1* | 1/2019 | Ogura | H01L 29/0619 |

FOREIGN PATENT DOCUMENTS

| | | |
|---|---|---|
| JP | 2008-060416 A | 3/2008 |
| JP | 2010-129973 A | 6/2010 |
| JP | 2011-176077 A | 9/2011 |
| JP | 2012-138567 A | 7/2012 |
| JP | 2012-227255 A | 11/2012 |
| JP | 2013-171931 A | 9/2013 |
| JP | 2013-201400 A | 10/2013 |
| JP | 2014-060362 A | 4/2014 |
| JP | 2016-111207 A | 6/2016 |
| JP | 2016-154218 A | 8/2016 |
| JP | 2016-157934 A | 9/2016 |
| WO | 2014/174911 A1 | 10/2014 |
| WO | 2015/093190 A1 | 6/2015 |
| WO | 2016-125490 A1 | 8/2016 |

OTHER PUBLICATIONS

An Office Action mailed by the German Patent and Trademark Office dated Feb. 8, 2021, which corresponds to German Patent Application No. 10 2018 211 354.8 and is related to U.S. Appl. No. 16/596,950; with English language translation.

* cited by examiner

SEMICONDUCTOR DEVICE, METHOD OF MANUFACTURING SEMICONDUCTOR DEVICE, POWER CONVERSION DEVICE

CROSS-REFERENCE TO RELATED APPLICATIONS

This application is a Divisional Application of U.S. patent application Ser. No. 15/951,262 filed Apr. 12, 2018, which claims benefit of Japanese Patent Application No. 2017-176838 filed Sep. 14, 2017, the entire contents of which are incorporated herein by reference.

BACKGROUND

Field

The present invention relates to a semiconductor device, a method of manufacturing a semiconductor device and a power conversion device.

Background Art

In general, power devices are required to have low loss, withstand voltage holding capability, guarantee of a safe operation area which prevents the devices from falling into destruction during operation, and the like. Therefore, miniaturization and weight saving of the devices have progressed, which have led, in a broad sense, to care for the global environment by reduction of energy consumption. Furthermore, it has been required to realize these characteristics at the possible lowest cost. IGBT (Insulated Gate Bipolar Transistor) has been widely used as one configuration for solving the above problem.

Japanese Unexamined Patent Application Publication No. 2016-157934 A discloses an $n^-$-type semiconductor substrate functioning as a drift layer, a p-type base layer formed on the drift layer, and a carrier storage layer configured to have a higher impurity concentration than the drift layer. The carrier storage layer is provided between the drift layer and the base layer.

A period during which a semiconductor device such as an IGBT switches from OFF-state to ON-state is defined as a turn-on period, and a period during which the semiconductor device switches from ON-state to OFF-state is defined as a turn-off period. In the turn-on period and the turn-off period, the semiconductor device may generate noise to cause malfunction of other devices, or the semiconductor device itself may malfunction. For example, when the potential of the drift layer or the carrier store layer varies, a displacement current flows in a gate electrode to change the gate potential, resulting in a risk that malfunction occurs. Furthermore, when the potential around the gate electrode varies under short-circuit of the device, a displacement current flows in the gate electrode to increase the gate potential, resulting in a risk that the short-circuit current increases and damages the device.

A method of reducing the depth of a trench type gate electrode from the surface of a substrate may be considered in order to prevent an adverse effect caused by the displacement current flowing in the gate electrode. However, this method lowers the main withstand voltage between an emitter and a collector.

SUMMARY

The present invention has been implemented to solve the foregoing problems, and has an object to provide a semiconductor device, a method of manufacturing a semiconductor device and a power conversion device that can suppress a displacement current flowing in a gate electrode.

In some examples, a semiconductor device includes a first conductivity type substrate, a first conductivity type carrier store layer formed on an upper surface side of the substrate, a second conductivity type channel dope layer formed on the carrier store layer, a first conductivity type emitter layer formed on the channel dope layer, a gate electrode in contact with the emitter layer, the channel dope layer and the carrier store layer via a gate insulating film, and a second conductivity type collector layer formed on a lower surface side of the substrate, wherein the gate insulating film has a first part in contact with the emitter layer and the channel dope layer, a second part in contact with the carrier store layer, and a third part in contact with the substrate, and at least a part of the second part is thicker than the first part and the third part.

In some examples, a semiconductor device include a first conductivity type substrate, a first conductivity type carrier store layer formed on an upper surface side of the substrate, a second conductivity type channel dope layer formed on the carrier store layer, a first conductivity type emitter layer formed on the channel dope layer, a gate electrode in contact with the emitter layer, the channel dope layer and the carrier store layer via a gate insulating film, a conductor layer in contact with the carrier store layer and the substrate via an isolation insulating film, a separation insulating film that covers a lower surface of the gate electrode and covers an upper surface of the conductor layer to thereby electrically separate the conductor layer and the gate electrode from each other, and a second conductivity type collector layer formed on a lower surface side of the substrate.

In some examples, a semiconductor device includes a first conductivity type substrate, a first conductivity type carrier store layer formed on an upper surface side of the substrate, a second conductivity type channel dope layer formed on the carrier store layer, a first conductivity type emitter layer formed on the channel dope layer, a second conductivity type diffusion layer that is formed on the channel dope layer and adjacent to the emitter layer, a first gate insulating film in contact with the emitter layer, the channel dope layer below the emitter layer and the carrier store layer below the emitter layer, a second gate insulating film that is in contact with the diffusion layer, the channel dope layer below the diffusion layer, and the carrier store layer below the diffusion layer, and thicker than the first gate insulating film, a gate electrode in contact with the first gate insulating film, and a second conductivity type collector layer formed on a lower surface side of the substrate.

In some examples, a semiconductor device includes a first conductivity type substrate, a first conductivity type carrier store layer formed on an upper surface side of the substrate, a second conductivity type channel dope layer formed on the carrier store layer, a first conductivity type emitter layer formed on the channel dope layer, a gate electrode in contact with the emitter layer, the channel dope layer and the carrier store layer via a gate insulating film, and a second conductivity type collector layer formed on a lower surface side of the substrate, wherein the gate electrode has a first gate electrode on an upper surface side of the substrate, and a second gate electrode that is in contact with a lower surface of the first gate electrode and has a smaller impurity concentration than the first gate electrode, and a boundary between the first gate electrode and the second gate electrode is located beside the carrier store layer.

In some examples, a method of manufacturing a semiconductor device includes forming a first conductivity type carrier store layer on a first conductivity type substrate, forming a second conductivity type channel dope layer on the carrier store layer, and forming a first conductivity type emitter layer on the channel dope layer, implanting ions into a side wall portion of the carrier store layer, forming a gate insulating film on a side wall portion of the carrier store layer, a side wall portion of the channel dope layer, a side wall portion of the emitter layer and the substrate, and forming a gate electrode in contact with the gate insulating film.

In some examples, a method of manufacturing a semiconductor device includes forming a first conductivity type carrier store layer on a first conductivity type substrate, forming a second conductivity type channel dope layer on the carrier store layer, and forming a first conductivity type emitter layer on the channel dope layer, forming a trench in the emitter layer, the channel dope layer and the carrier store layer so that the substrate is exposed to the trench, forming an isolation insulating film at a portion exposed to the trench and embedding the trench with a conductor layer, partially removing the conductor layer and the isolation insulating film to partially expose a side surface of the emitter layer, a side surface of the channel dope layer and a side surface of the carrier store layer, and forming a separation insulating film on an upper surface of the conductor layer, partially forming a gate insulating film on the side surface of the emitter layer, the side surface of the channel dope layer and the side surface of the carrier store layer, and embedding the trench with a gate electrode.

In some examples, a method of manufacturing a semiconductor device includes forming a first conductivity type carrier store layer on a first conductivity type substrate, forming a second conductivity type channel dope layer on the carrier store layer, and forming a first conductivity type emitter layer partially on the channel dope layer, forming a trench at a portion where the emitter layer is formed in plan view so that the trench has a linear side surface in plan view and the substrate is exposed to the trench, and forming a trench at a portion where the emitter layer is not formed in plan view so that the trench has a bellows-shaped side surface in plan view and the substrate is exposed to the trench, performing thermal oxidation on the side surfaces of the emitter layer, the channel dope layer and the carrier store layer and the substrate exposed to the trench to form a gate insulating film, and forming a gate electrode in contact with the gate insulating film.

In some examples, a method of manufacturing a semiconductor device includes forming a first conductivity type carrier store layer on a first conductivity type substrate, forming a second conductivity type channel dope layer on the carrier store layer, and forming a first conductivity type emitter layer partially on the channel dope layer, partially etching a portion where the emitter layer is formed in plan view and a portion where the emitter layer is not formed in plan view, thereby forming a first trench to which the substrate is exposed, embedding the first trench with a gate insulating film, etching a part of the gate insulating film at the portion where the emitter layer is formed in plan view so that the emitter layer, the channel dope layer, the carrier store layer and the substrate are not exposed, thereby forming a second trench in the gate insulating film, embedding the second trench with a gate electrode, and forming a gate wire on the gate insulating film at the portion where the emitter layer is not formed in plan view and the gate electrode.

In some examples, a power conversion device includes a semiconductor device having a first conductivity type substrate, a first conductivity type carrier store layer formed on an upper surface side of the substrate, a second conductivity type channel dope layer formed on the carrier store layer, a first conductivity type emitter layer formed on the channel dope layer, a gate electrode in contact with the emitter layer, the channel dope layer and the carrier store layer via a gate insulating film, and a second conductivity type collector layer formed on a lower surface side of the substrate, wherein the gate insulating film has a first part in contact with the emitter layer and the channel dope layer, a second part in contact with the carrier store layer, and a third part in contact with the substrate, and at least a part of the second part is thicker than the first part and the third part, a main conversion circuit for converting input power and outputting the converted power, a driving circuit for outputting, to the semiconductor device, a driving signal for driving the semiconductor device, and a control circuit for outputting, to the driving circuit, a control signal for controlling the driving circuit.

Other and further objects, features and advantages of the invention will appear more fully from the following description.

DETAILED DESCRIPTION

A semiconductor device, a method of manufacturing a semiconductor device and a power conversion device according to embodiments of the present invention will be described with reference to the drawings. The same or corresponding constituent devices are represented by the same reference signs, and duplicative descriptions thereof may be omitted.

First Embodiment

Figure 1:
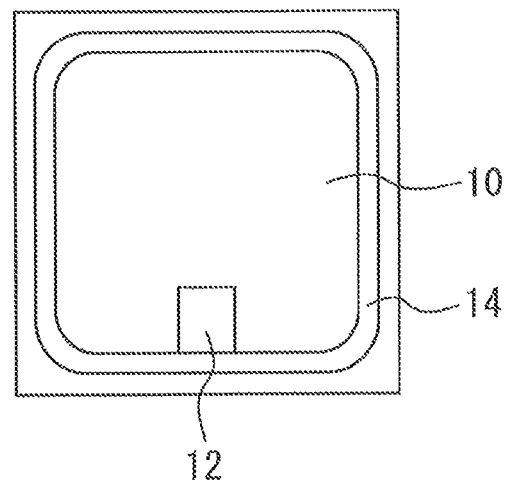
FIG. 1 is a plan view showing a semiconductor device according to a first embodiment.

FIG. 1 is a plan view showing a semiconductor device according to a first embodiment. Plural semiconductor devices are formed on a wafer, and one of these semiconductor devices is shown in FIG. 1. This semiconductor device constitutes one IGBT chip. The semiconductor device includes an device region 10, a gate pad region 12, and a withstand voltage holding region 14 surrounding the device region 10 and the gate pad region 12. Whether current flows in the device region 10 or not is determined according to a voltage applied to the gate pad region 12. The withstand voltage holding region 14 is formed to extend a depletion layer to the outside of the device region 10.

Figure 2:
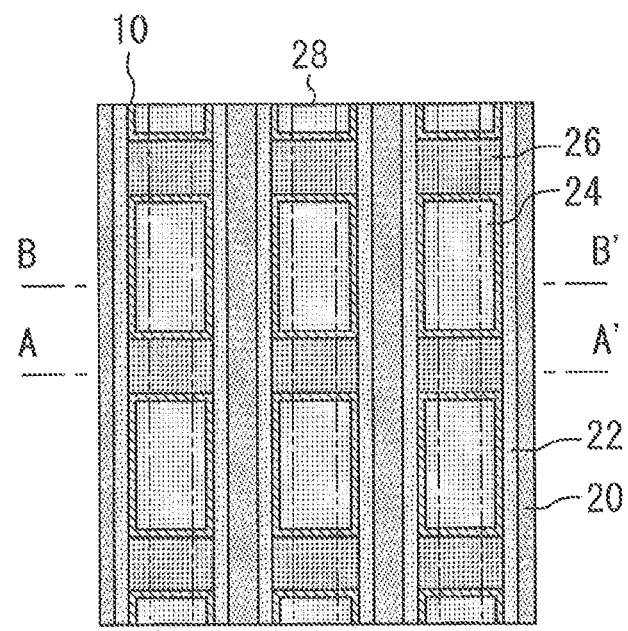
FIG. 2 is a partially enlarged plan view of the device region of FIG. 1.

FIG. 2 is a partially enlarged plan view of the device region 10 of FIG. 1. Plural linear gate electrodes 20 are provided in the device region 10. The gate electrodes 20 are formed of, for example, polysilicon. A gate insulating film 22 is in contact with the gate electrode 20. A diffusion layer 24 and an emitter layer 26 are in contact with the gate insulating film 22. In FIG. 2, a hatched portion is also a part of the diffusion layer 24. The hatched portion has a second conductivity type impurity concentration which is lower than that at the center portion of the diffusion layer 24. The diffusion layer 24 is a p-type conductivity type, and the emitter layer 26 is an n-type conductivity type. Hereinafter, n-type will be referred to as "first conductivity type", and p-type will be referred to as "second conductivity type". The conductivity types of the respective portions may be inverted. Regions surrounded by broken lines in FIG. 2 are emitter contact regions 28.

Figure 3:
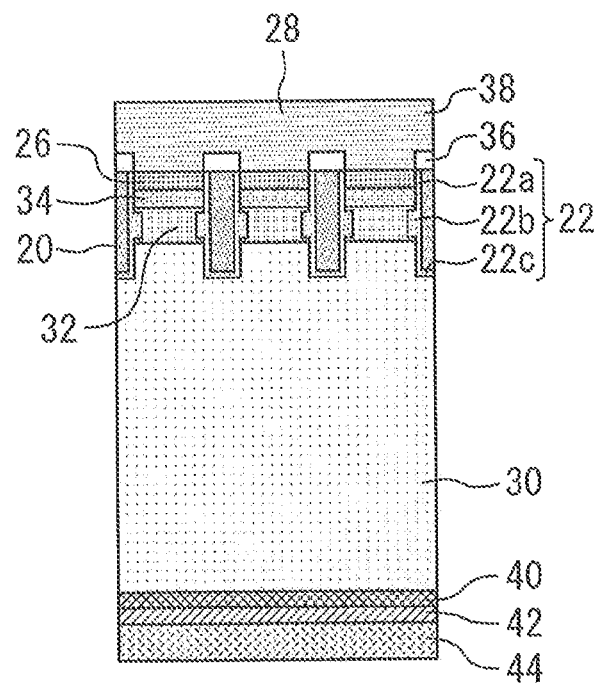
FIG. 3 is a cross-sectional view taken along A-A' line of FIG. 2.

FIG. 3 is a cross-sectional view taken along A-A' line of FIG. 2. A substrate 30 is a portion functioning as a drift layer. The substrate 30 is formed of first conductivity type Si, for example. The substrate has an $n^-$-type conductivity type. First conductivity type carrier store layers 32 are provided on the upper surface side of the substrate 30. Second conductivity type channel dope layers 34 are provided on the carrier store layers 32. First conductivity type emitter layers 26 are provided on the channel dope layers 34. The carrier store layer 32, the channel dope layer 34 and the emitter layer 26 are n-type, p-type, an $n^+$-type layers, respectively.

The gate electrode 20 is in contact with the emitter layer 26, the channel dope layer 34, the carrier store layer 32 and the substrate 30 via a gate insulating film 22. The gate insulating film 22 has a first part 22a in contact with the emitter layer 26 and the channel dope layer 34, a second part 22b in contact with the carrier store layer 32 and a third part 22c in contact with the substrate 30. At least a part of the second part 22b is thicker than the first part 22a and the third part 22c. In other words, a part having the largest thickness in the gate insulating film 22 is present at a portion sandwiched between the gate electrode 20 and the carrier store layer 32.

An emitter electrode 38 in contact with the emitter layers 26 is provided on the emitter layers 26. An inter-layer insulating film 36 is provided between the emitter electrode 38 and the gate electrode 20, so that the emitter electrode 38 and the gate electrode 20 are electrically insulated from each other.

A first conductivity type buffer layer 40 is formed on the lower surface side of the substrate 30. The buffer layer 40 may be configured as an n-type layer. A second conductivity type collector layer 42 is formed on the lower surface side of the buffer layer 40. The collector layer 42 may be configured as a $p^+$-type layer. A collector electrode 44 is formed on the lower surface side of the collector layer 42. Another structure having the collector layer 42 may be adopted as the structure on the lower surface side of the substrate 30.

Figure 4:
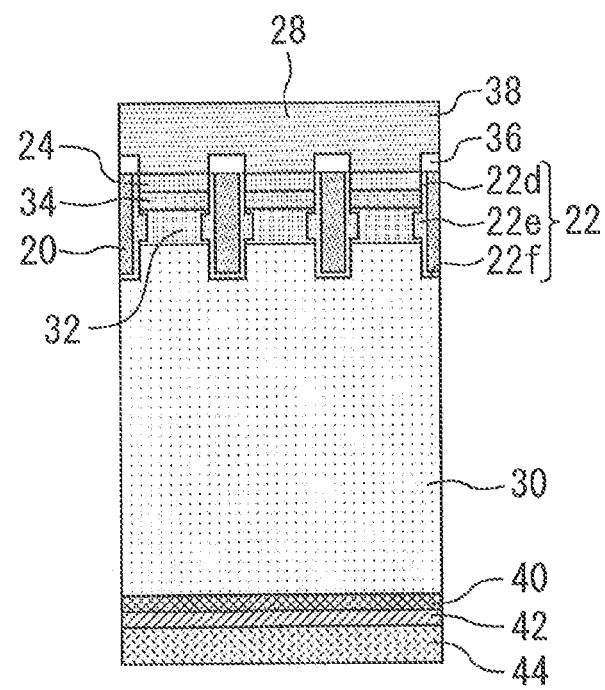
FIG. 4 is a cross-sectional view taken along B-B' line of FIG. 2.

FIG. 4 is a cross-sectional view taken along B-B' line of FIG. 2. The diffusion layer 24 is provided on the channel dope layer 34. The diffusion layer 24 is a second conductivity type layer adjacent to the emitter layer 26. The diffusion layer 24 may be configured as a $p^+$-type layer. The gate insulating film 22 has a fourth part 22d in contact with the diffusion layer 24 and the channel dope layer 34 below the diffusion layer 24, a fifth part 22e in contact with the carrier store layer 32 below the diffusion layer 24, and a sixth part 22f in contact with the substrate 30 below the diffusion layer 24. At least a part of the fifth part 22e is thicker than the fourth part 22d and the sixth part 22f. In other words, a part having the largest thickness in the gate insulating film 22 is present at a portion sandwiched between the gate electrode 20 and the carrier store layer 32. The fifth part 22e of FIG. 4 has the same shape as the second part 22b of FIG. 3.

Figure 5:
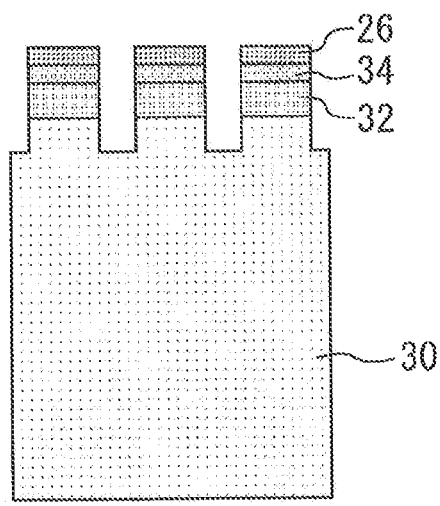
FIG. 5 is a cross-sectional view of a semiconductor device under manufacturing.

A method of manufacturing the semiconductor device according to the first embodiment will be described. First, the carrier store layer 32 is formed on the substrate 30, the channel dope layer 34 is formed on the carrier store layer 32, and the emitter layer 26 is formed on the channel dope layer 34. Thereafter, the emitter layer 26, the channel dope layer 34 and the carrier store layer 32 are partially etched to form trenches, thereby exposing the substrate 30. FIG. 5 is a cross-sectional view of a semiconductor device in which trenches for exposing the substrate 30 are formed.

Figure 6:
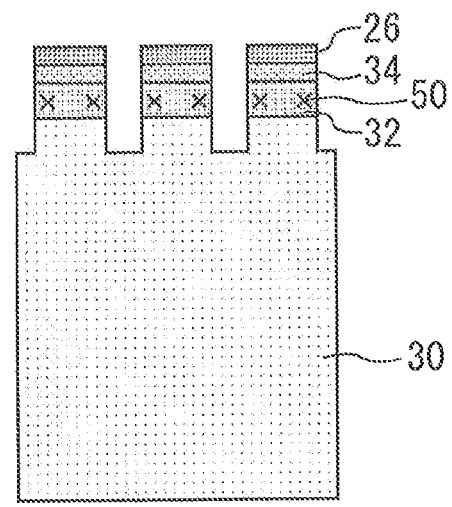
FIG. 6 is a cross-sectional view of a semiconductor device under manufacturing.

Next, ions are implanted into side wall portions of the carrier store layers 32. Ions are implanted into the side wall portions of the carrier store layers 32, for example by using a general photoengraving technique and an ion implantation technique. FIG. 6 is a cross-sectional view of the semiconductor device, and shows that ion-implanted portions 50 are formed at the side wall portions of the carrier store layers 32. The purpose of local implantation of ions to form the ion-implanted portions 50 is to increase an oxidation rate.

Figure 7:
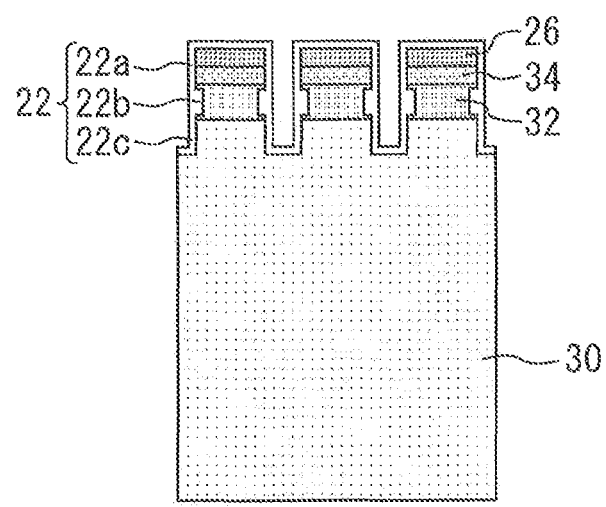
FIG. 7 is a cross-sectional view of a semiconductor device under manufacturing.

Next, the gate insulating film is formed on the side wall portions of the carrier store layers 32, the side wall portions of the channel dope layers 34, the side wall portions of the emitter layer 26 and the substrate 30. FIG. 7 is a cross-sectional view of the semiconductor device in which the gate insulating film 22 is formed. The gate insulating film 22 is formed, for example by thermal oxidation which is a method of performing oxidation at a high temperature. Since the ion-implanted portions 50 are formed in the carrier store layers 32, the oxidation progresses particularly at these portions. As a result, the second part 22b out of the gate insulating film 22 is formed to have the largest thickness. Next, the gate electrodes 20 in contact with the gate insulating film 22 are formed. Subsequently, well-known processing is performed, and then the semiconductor device shown in FIGS. 1 to 4 is completed.

Next, the operation of the semiconductor device according to the first embodiment will be described. When the semiconductor device is turned on to be set to a conductive state, a positive voltage is applied to the gate electrode 20. At this time, a MOSFET including the emitter layer 26, the channel dope layer 34, the carrier store layer 32, the gate insulating film 22 and the gate electrode 20 is turned on, so that electrons from the emitter electrode 38 and holes from the collector electrode 44 flow into the substrate 30, and the carriers are accumulated in the substrate 30, whereby conductivity modulation occurs. As a result, the voltage between the collector and the emitter decreases, and the semiconductor device is set to the conductive state.

On the other hand, when the semiconductor device is set to an OFF-state, the voltage of the gate electrode 20 is set to a threshold voltage or less of the MOSFET including the emitter layer 26, the channel dope layer 34, the carrier store layer 32, the gate insulating film 22 and the gate electrode 20. As a result, the carriers to flow from the emitter electrode 38 and the collector electrode 44 into the substrate 30 are blocked, and excessive carriers accumulated in the substrate 30 are discharged, and the substrate 30 is depleted, whereby the semiconductor device is set to the OFF-state. When the semiconductor device according to the first embodiment is provided as a part of an inverter circuit, the ON-state and the OFF state of the semiconductor device are repeated.

When the semiconductor device is turned on, a displacement current flows from the gate insulating film 22 functioning as a capacitive component due to voltage variation of the substrate 30, variation of current flowing in the channel of the MOSFET described above or the like. Since current is liable to concentrate particularly at the interface between the carrier store layer 32 having a high impurity concentration and the gate insulating film 22, the carrier store layer 32 may be influenced by the current variation to cause an undesirable operation such as oscillation. Lift-up of the gate under short-circuit, increase of the value of dV/dt at the turn-on, etc. are considered as examples of the undesired operation. On the other hand, in the first embodiment, the displacement current itself can be reduced by increasing the thickness of the second part 22b in contact with the carrier store layer 32. Therefore, it can be made difficult to cause the undesired operation such as malfunction.

Furthermore, since provision of the carrier store layer 32 enhances the carrier accumulation effect of the substrate 30 when the semiconductor device is turned on, an ON-voltage is lowered. Therefore, a stationary loss when an inverter circuit is configured by the semiconductor device can be reduced. These effects can be obtained when a thickly-formed portion of the second part 22b is merely in contact with a part of the carrier store layer 32. The thickly-formed portion out of the gate insulating film 22 may extend to a portion where the gate insulating film 22 is in contact with the substrate 30.

The thickness of the first part 22a of the gate insulating film 22 determines the channel current of the MOSFET of the semiconductor device. Accordingly, the thickness of the first part 22a must be set to a predetermined thickness. However, the thick portion of the second part 22b is approached to the first part 22a, there is a risk that the first part 22a may be also thickly formed due to process variations. Therefore, it is preferable that the portion of the second part 22b which is thicker than the first part 22a and the third part 22c is positioned apart from the first part 22a. In the first embodiment, only the center portion of the second part 22b is thicker than the first part 22a and the third part 22c. As a result, increase of the thickness of the first part 22a can be avoided even in consideration of the process variations.

Various modifications may be performed on the semiconductor device and the method of manufacturing the semiconductor device according to the first embodiment to the extent that the features thereof are not lost. With respect to the semiconductor device and the method of manufacturing the semiconductor device according to the following embodiments, the differences from the first embodiment will be mainly described because they have lots of common points to the first embodiment.

Second Embodiment

Figure 8:
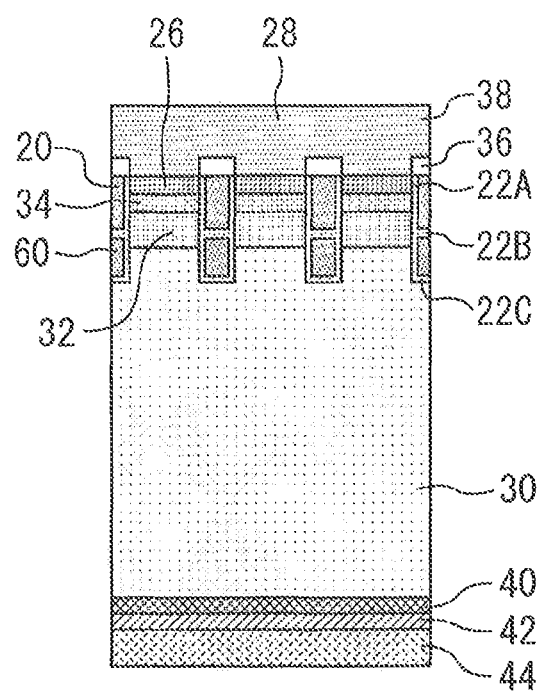
FIG. 8 is a cross-sectional view of the semiconductor device according to the second embodiment.

The plan view of the semiconductor device according to a second embodiment is the same as FIGS. 1 and 2, and thus omitted. FIG. 8 is a cross-sectional view of the semiconductor device according to the second embodiment. This cross-sectional view is a cross-sectional view showing a portion where the emitter layer 26 of the semiconductor device is present, and thus it may be said that FIG. 8 corresponds to the cross-sectional view taken along A-A' line of FIG. 2. The gate electrode 20 is in contact with the emitter layer 26, the channel dope layer 34 and the carrier store layer 32 via a gate insulating film 22A. The upper surface of the gate electrode 20 is covered by the inter-layer insulating film 36 except for a portion connected to a gate wire. The side surface of the gate electrode 20 is covered by the gate insulating film 22A. The lower surface of the gate electrode 20 is covered by a separation insulating film 22B.

A conductor layer 60 is formed below the separation insulating film 22B. The conductor layer 60 is formed at the same width as the gate electrode 20 just below the gate electrode 20. The conductor layer 60 is in contact with the carrier store layer 32 and the substrate 30 via an isolation insulating film 22C. The upper surface of the conductor layer 60 is covered by the separation insulating film 22B, and the side surface and the lower surface thereof are covered by the isolation insulating film 22C. The conductor layer 60 is surrounded by the separation insulating film 22B and the isolation insulating film 22C to be electrically insulated from the other conductors. That is, the potential of the conductor layer 60 is floated. It is preferable that the conductor layer 60 is wholly covered by the isolation insulating film 22C and the separation insulating film 22B.

Figure 9:
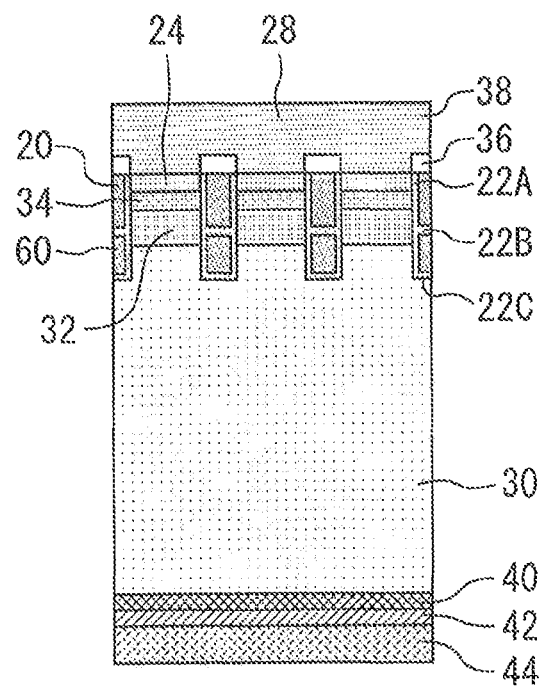
FIG. 9 is a cross-sectional view of the semiconductor device according to the second embodiment.

FIG. 9 is a cross-sectional view showing a portion where the diffusion layers 24 of the semiconductor layer according to the second embodiment are present. It may be said that FIG. 9 corresponds to the cross-sectional view taken along B-B' line FIG. 2. The gate insulating film 22A, the separation insulating film 22B, the isolation insulating film 22C, the gate electrode 20 and the conductor layer 60 are also provided at the portion where the diffusion layer 24 is present. These devices are connected to the gate insulating film 22A, the separation insulating film 22B, the isolation insulating film 22C, the gate electrode 20 and the conductor layer 60 of FIG. 8.

As described above, the semiconductor device according to the second embodiment is provided with the separation insulating film 22B which covers the lower surface of the gate electrode 20 and also covers the upper surface of the conductor layer 60 to electrically separate the conductor layer 60 and the gate electrode 20 from each other. It is preferable that the height of the separation insulating film 22B and the intermediate height of the carrier store layer 32 are equal to each other. That is, it is preferable to provide the separation insulating film 22B beside the intermediate position between the upper and lower surfaces of the carrier store layer 32. Since the capacitance of the gate electrode 20 which is viewed from the carrier store layer 32 or the substrate 30 located below the separation insulating film 22B is equal to the series sum of the capacitance of the isolation insulating film 22C and the capacitance of the separation insulating film 22B, the effective capacitance can be reduced. Therefore, the displacement current occurring due to the potential variation of the carrier store layer 32 or the substrate 30 is reduced, so that the variation of the gate potential can be suppressed. This effect can be obtained by providing the separation insulating film 22B beside the carrier store layer 32.

Figure 10:
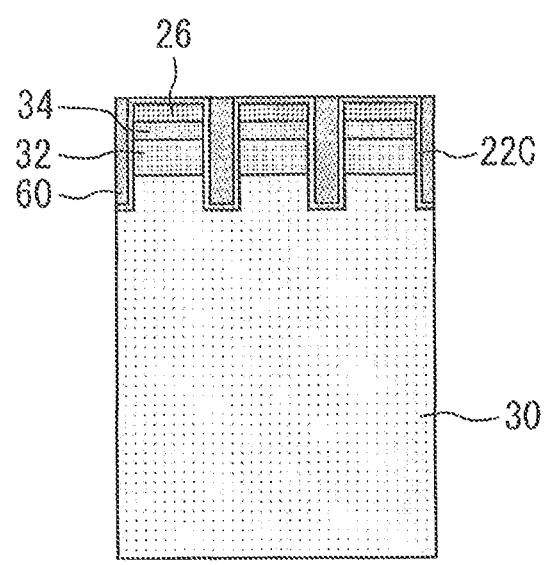
FIG. 10 is a cross-sectional view of a semiconductor device under manufacturing.

A method of manufacturing the semiconductor device according to the second embodiment will be described with reference to FIGS. 10 to 14 which are cross-sectional views. First, a structure shown in FIG. 10 is manufactured by a well-known method. FIG. 10 is a cross-sectional view of a semiconductor device under manufacturing. As shown in FIG. 10, the carrier store layer 32 is formed on the substrate 30, the channel dope layer 34 is formed on the carrier store layer 32, and the emitter layer 26 is formed on the channel dope layer 34. Subsequently, trenches to which the substrate 30 is exposed are formed in the emitter layer 26, the channel dope layer 34 and the carrier store layer 32, the isolation insulating film 22C is formed on portions exposed to the trenches, and the trenches are embedded with the conductor layers 60. The isolation insulating film 22C is a silicon oxide film, for example. The conductor layers 60 are formed of polysilicon, for example.

Figure 11:
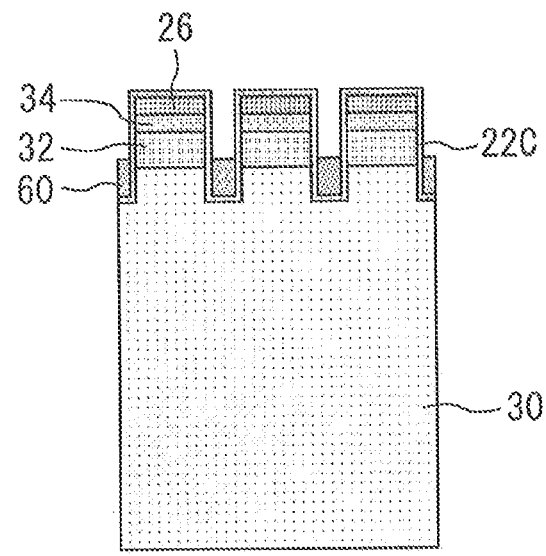
FIG. 11 is a cross-sectional view of a semiconductor device under manufacturing.
Figure 12:
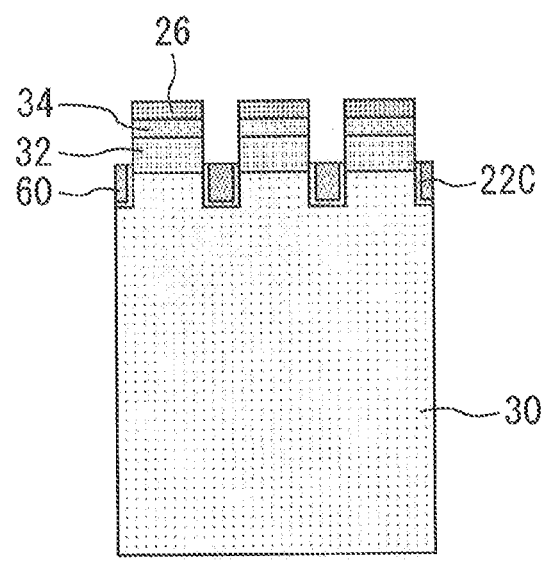
FIG. 12 is a cross-sectional view of a semiconductor device under manufacturing.

Subsequently, a structure shown in FIG. 11 is manufactured. FIG. 11 shows that parts of the conductor layers 60 are removed. In this step, parts of the conductor layers 60 are selectively etched back. The upper surface of the conductor layer 60 is located beside the carrier store layer 32. Subsequently, a structure shown in FIG. 12 is manufactured. FIG. 12 shows that parts of the isolation insulating films 22C are selectively removed. First, parts of the conductor layers 60 are removed as described with reference to FIG. 11, and then the parts of the isolation insulating films 22C are removed, whereby the side surfaces of the emitter layers 26, the side surfaces of the channel dope layers 34 and the side surfaces of the carrier store layers 32 are partially exposed.

Figure 13:
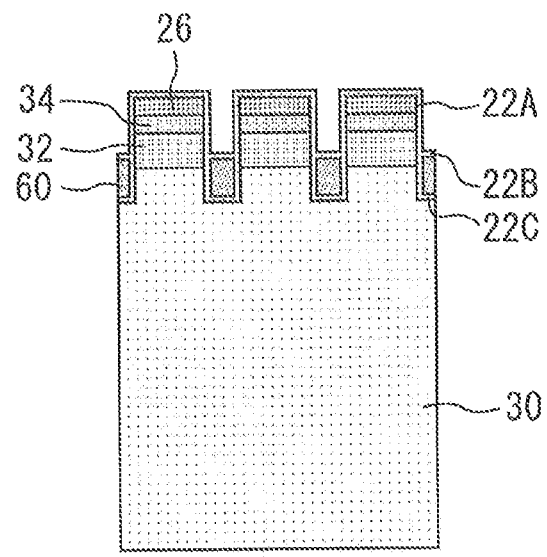
FIG. 13 is a cross-sectional view of a semiconductor device under manufacturing.

Subsequently, a structure shown in FIG. 13 is manufactured by performing gate oxidation. FIG. 13 shows that the separation insulating film 22B is formed on the upper surface of the conductor layer 60, and the gate insulating film 22A is formed on parts of the side surface of the emitter layer 26, the side surface of the channel dope layer 34 and the side surface of the carrier store layer 32. The separation insulating film 22B and the gate insulating film 22A can be formed by one oxidation processing.

Figure 14:
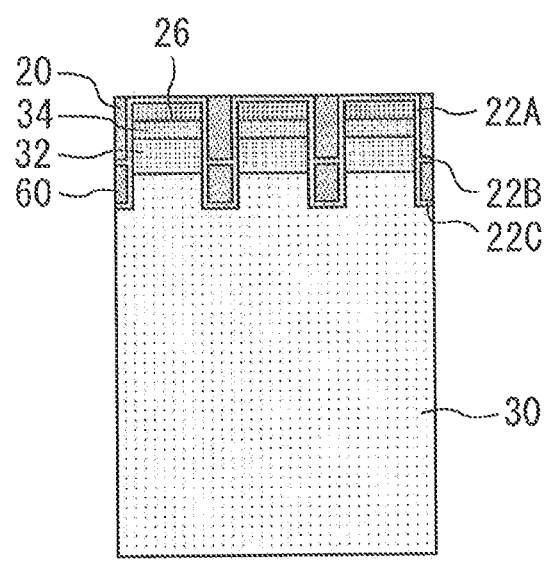
FIG. 14 is a cross-sectional view of a semiconductor device under manufacturing.

Subsequently, as shown in FIG. 14, the trenches above the separation insulating films 22B are embedded with the gate electrodes 20. The gate electrodes 20 can be formed by deposition of polysilicon and selective etch-back of polysilicon, for example. Thereafter, the process is advanced by a well-known method to complete the semiconductor device shown in FIGS. 8 and 9.

Third Embodiment

Figure 15:
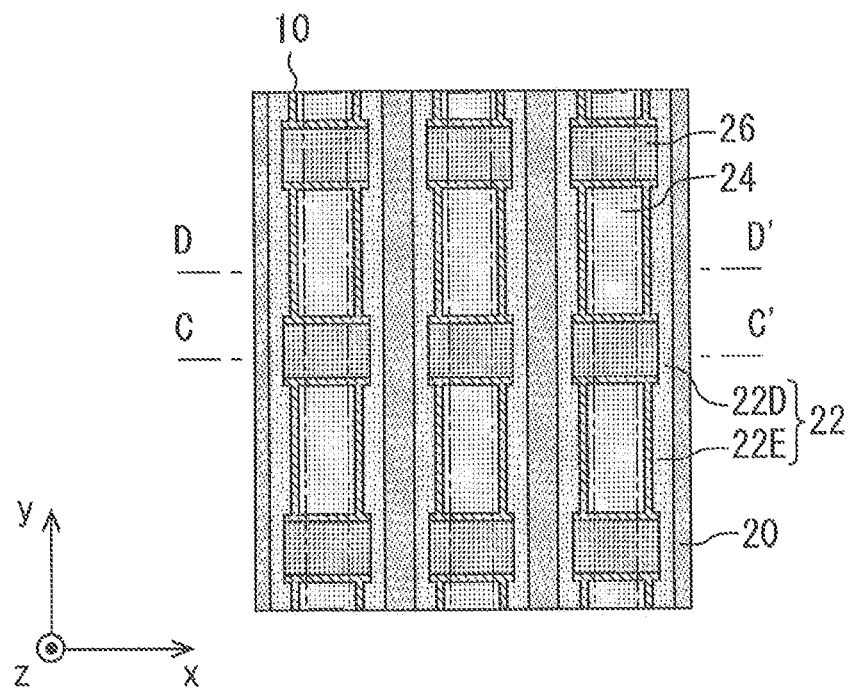
FIG. 15 is a plan view of a semiconductor device according to a third embodiment.

FIG. 15 is a plan view of a semiconductor device according to a third embodiment. The gate insulating film 22 includes a first gate insulating film 22D, and a second gate insulating film 22E connected to the first gate insulating film 22D. The first gate insulating film 22D is in contact with the emitter layer 26, and the second gate insulating film 22E is in contact with the diffusion layer 24. The lengths of the first and second gate insulating films 22D and 22E along an x-axis correspond to the thicknesses of the first and second gate insulating films 22D and 22E. The second gate insulating film 22E is thicker than the first gate insulating film 22D. That is, when the semiconductor device is set to the ON-state, the gate insulating film in contact with a portion where no channel is formed is thicker than the gate insulating film in contact with a portion where a channel is formed. The diffusion layer 24 is smaller in length along the x-axis than the emitter layer 26 by an amount by which the second gate insulating film 22E is thicker than the first gate insulating film 22D. Accordingly, the diffusion layer 24 is smaller in width than the emitter layer 26 in plan view.

Figure 16:
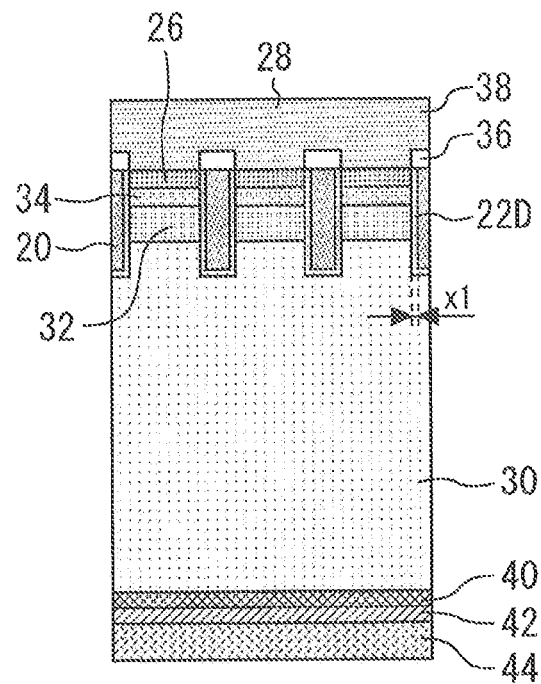
FIG. 16 is a cross-sectional view of the semiconductor device taken along C-C' line of FIG. 15.
Figure 17:
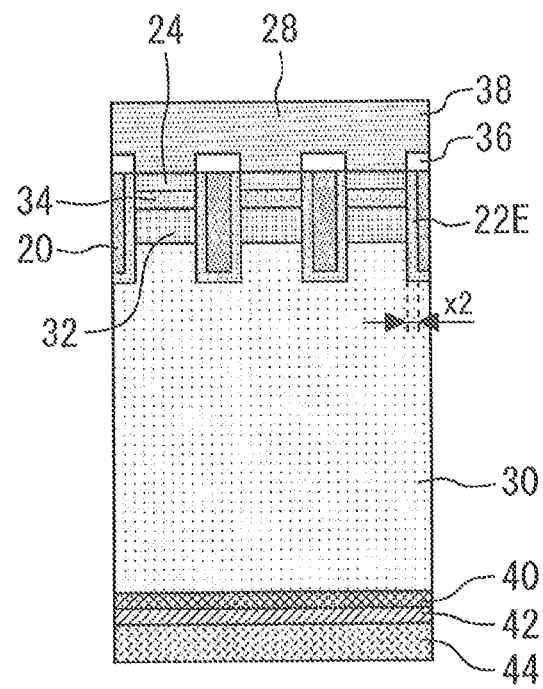
FIG. 17 is a cross-sectional view of the semiconductor device taken along D-D' line of FIG. 15.

FIG. 16 is a cross-sectional view of the semiconductor device taken along C-C' line of FIG. 15. The first gate insulating film 22D is in contact with the emitter layer 26, the channel dope layer 34 below the emitter layer 26, the carrier store layer 32 below the emitter layer 26 and the substrate 30. The width of the first gate insulating film 22D is represented by x1. FIG. 17 is a cross-sectional view of the semiconductor device taken along D-D' line of FIG. 15. The second gate insulating film 22E is in contact with the diffusion layer 24, the channel dope layer 34 below the diffusion layer 24, the carrier store layer 32 below the diffusion layer 24 and the substrate 30. The width x2 of the second gate insulating film 22E is larger than the width x1 of the first gate insulating film 22D. The gate electrode 20 is in contact with both the first gate insulating film 22D and the second gate insulating film 22E.

As described above, the second gate insulating film 22E is configured to be thicker than the first gate insulating film 22D, whereby the value of the capacitance Cge between the gate and the emitter and the value of the capacitance Cgc between the gate and the collector can be reduced. As a result, the displacement current which flows in the gate electrode due to variation of the potential around the gate insulating film 22 can be reduced, so that increase of short-circuit current, etc. caused by lift-up of the gate can be prevented. In addition, the first gate insulating film 22D contributing to formation of the channel can be configured to have a predetermined thickness.

Figure 18:
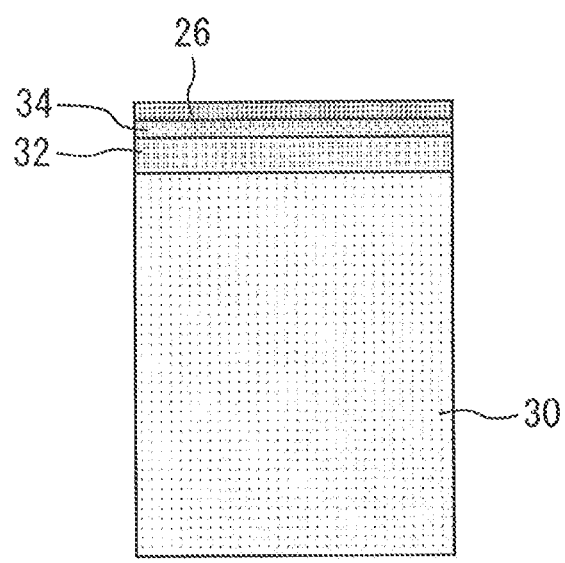
FIG. 18 is a cross-sectional view of a semiconductor device under manufacturing.
Figure 19:
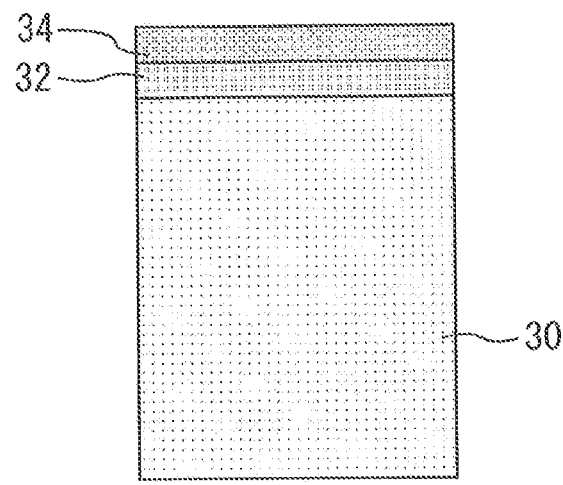
FIG. 19 is a cross-sectional view of a semiconductor device under manufacturing.

A method of manufacturing the semiconductor device according to the third embodiment will be described. First, structures shown in FIGS. 18 and 19 are manufactured. FIG. 18 is a cross-sectional view of a portion containing the emitter layer 26. FIG. 18 shows a semiconductor device under manufacturing on a cross-section along C-C' line of FIG. 15. FIG. 19 is a cross-sectional view of a portion where the diffusion layer 24 is formed. FIG. 19 shows a semiconductor device under manufacturing on a cross-section along D-D' line of FIG. 15. The carrier store layer 32 is formed on the substrate 30, the channel dope layer 34 is formed on the carrier store layer 32, and the emitter layer 26 is formed partially on the channel dope layer 34. The structures shown in FIGS. 18 and 19 can be obtained as described above.

Figure 20:
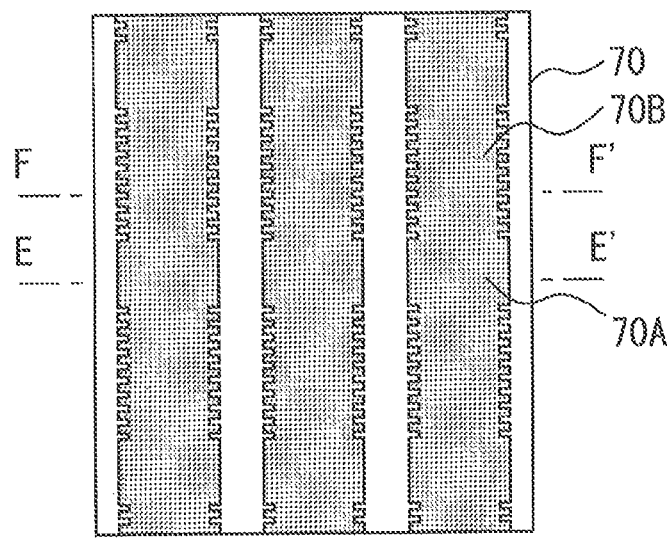
FIG. 20 is a plan view of a photoengraving mask.

Subsequently, trenches for forming the gate insulating film and the gate electrodes are formed in the structures shown in FIGS. 18 and 19. FIG. 20 is a plan view of a photoengraving mask 70 used to form the trenches. The mask 70 includes a first part 70A and a second part 70B. The mask 70 has a linear mask pattern at the first part 70A, and a bellows-shaped mask pattern at the second part 70B. Light exposure processing is performed on a resist coated on the semiconductor device under manufacturing by using the mask 70, and the exposed resist is developed to etch the exposed portion from the resist pattern until the substrate 30 is exposed, thereby obtaining structures shown in FIGS. 21 and 22.

Figure 21:
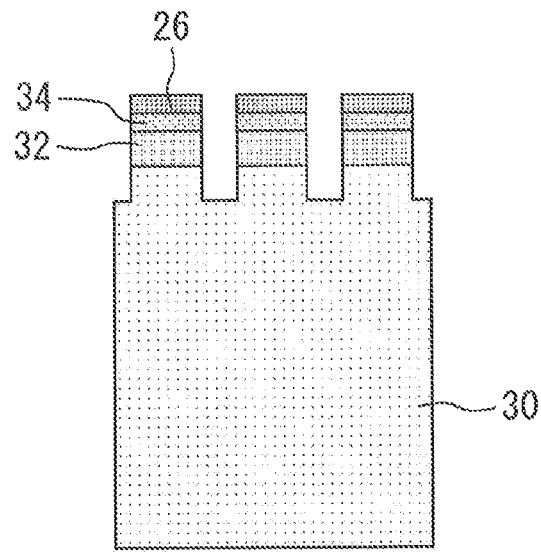
FIG. 21 is a cross-sectional view of a semiconductor device under manufacturing.
Figure 22:
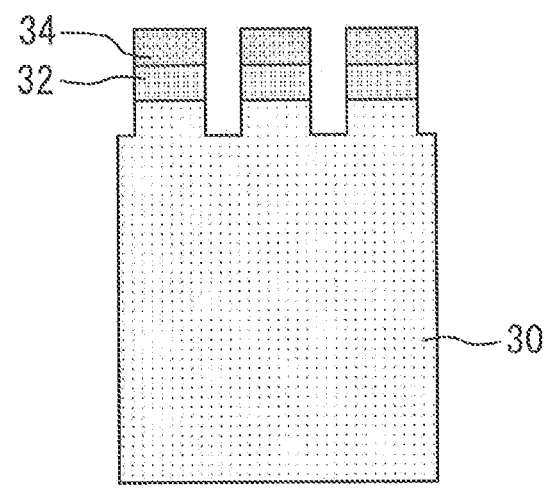
FIG. 22 is a cross-sectional view of a semiconductor device under manufacturing.

FIG. 21 is a cross-sectional view of the semiconductor device at a portion where the emitter layers 26 are present. FIG. 21 is a cross-sectional view at the same position as FIG. 18. FIG. 22 is a cross-sectional view of the semiconductor device at a portion where the emitter layer 26 is not present. FIG. 22 is a cross-sectional view at the same position as FIG. 19. A trench whose side surface is linear in plan view and from which the substrate 30 is exposed is formed by etching using the mask 70 at a portion where the emitter layer 26 is formed in plan view. Accordingly, the width of the trenches of FIG. 21 is uniform. A trench whose side surface is bellows-shaped in plan view and from which the substrate 30 is exposed is also formed at a portion where the emitter layer 26 is not formed in plan view. Accordingly, the trenches of FIG. 22 reflect the bellows-shape at the second part 70B of the mask 70, and the width thereof varies according to the position.

Figure 23:
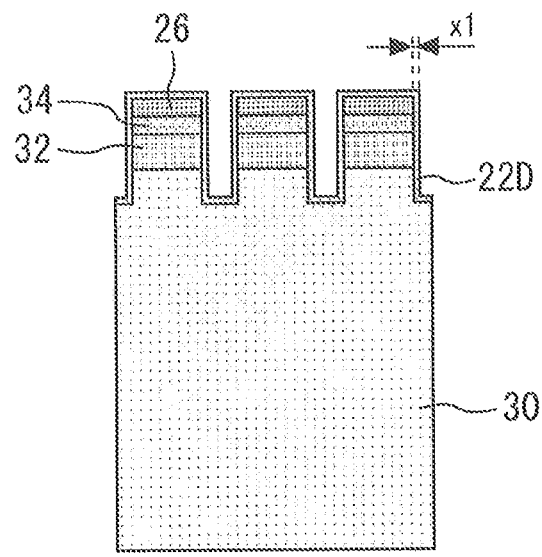
FIG. 23 is a cross-sectional view of a semiconductor device under manufacturing.
Figure 24:
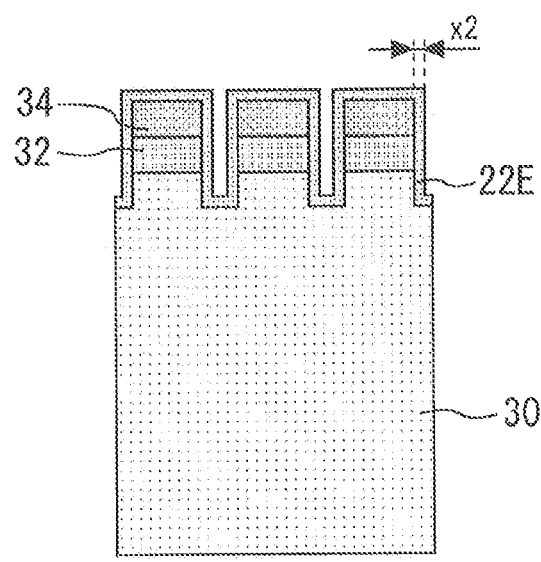
FIG. 24 is a cross-sectional view of a semiconductor device under manufacturing.

Subsequently, thermal oxidation is performed on the structures shown in FIGS. 21 and 22. Specifically, the side surfaces of the emitter layer 26, the channel dope layer 34 and the carrier store layer 32 and the substrate 30 exposed to the trench are subjected to thermal oxidation to form the gate insulating film. FIGS. 23 and 24 are cross-sectional views of structures obtained by performing thermal oxidation on the structures shown in FIGS. 21 and 22. In the thermal oxidation, the oxidation progresses from three directions at the portions which are formed in the bellows-shape in plan view. That is, describing based on the coordinate system of FIG. 15, oxidation progresses in an x positive direction or x negative direction and a y positive direction and a y negative direction. In the thermal oxidation, oxidation is promoted until oxide films developing from the three directions are connected to one another, and silicon of the bellows-shaped portions are vanished. As described above, as shown in FIGS. 23 and 24, the second gate insulating film 22E in contact with the diffusion layer 24 can be made thicker than the first gate insulating film 22D in contact with the emitter layer 26. Thereafter, the gate electrode 20 in contact with the gate insulating film 22 is formed, and the well-known process is executed, whereby the semiconductor device having the trench type gate portion can be manufactured.

Fourth Embodiment

Figure 25:
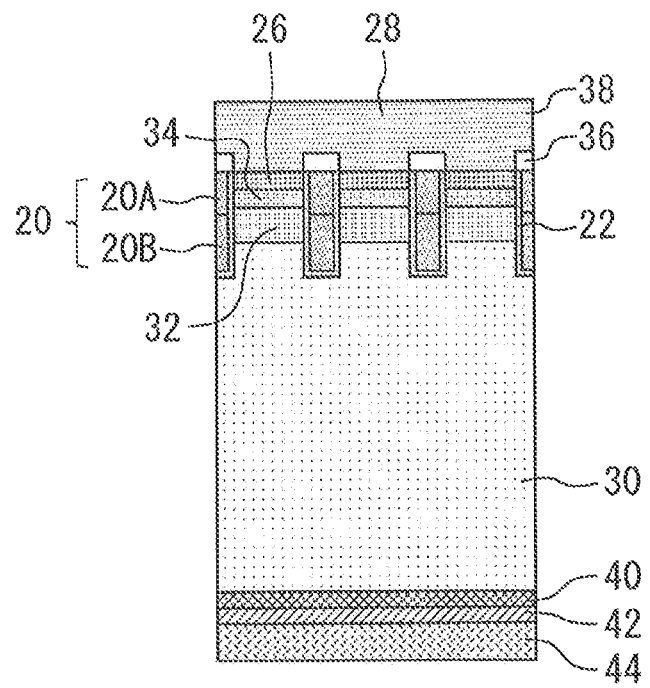
FIG. 25 is a cross-sectional view of a semiconductor device according to a fourth embodiment.
Figure 26:
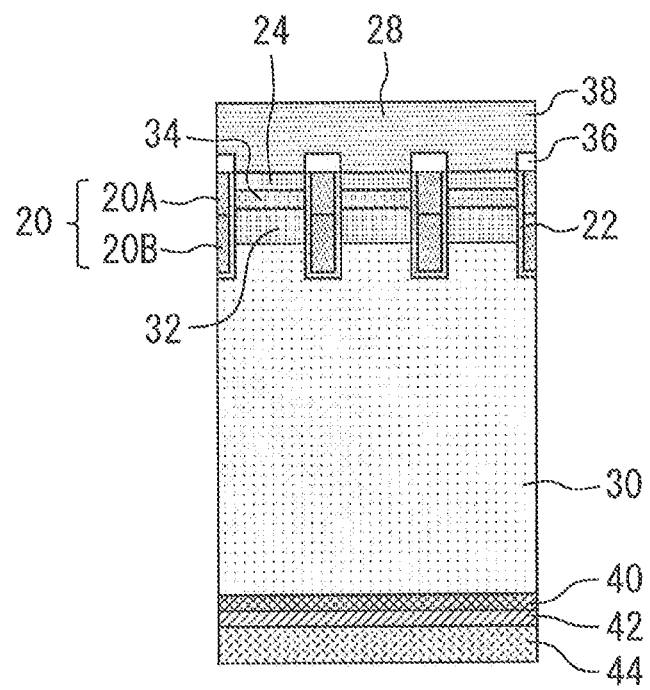
FIG. 26 is a cross-sectional view of a semiconductor device according to a fourth embodiment.

The plan view of a semiconductor device according to a fourth embodiment is the same as FIGS. 1 and 2, and thus omitted. FIGS. 25 and 26 are cross-sectional views of a semiconductor device according to a fourth embodiment. Since FIG. 25 is a cross-sectional view of a portion where the emitter layers 26 of the semiconductor device are present, it may be said that FIG. 25 corresponds to the cross-sectional view taken along A-A' line of FIG. 2. Since FIG. 26 is a cross-sectional view of a portion where the diffusion layers 24 of the semiconductor device are present, it may be said that FIG. 26 corresponds to the cross-sectional view taken along B-B' line of FIG. 2.

FIG. 25 shows the gate electrode 20 in contact with the emitter layer 26, the channel dope layer 34, the carrier store layer 32 and the substrate 30 via the gate insulating film 22. The gate electrode 20 includes a first gate electrode 20A on the upper surface side of the substrate 30, and a second gate electrode 20B which is in contact with the lower surface of the first gate electrode 20A, and has a smaller impurity concentration than that of the first gate electrode 20A. The first gate electrode 20A and the second gate electrode 20B are formed of doped polysilicon, for example. The boundary between the first gate electrode 20A and the second gate electrode 20B is located beside the carrier store layer 32. As shown in FIG. 26, as in the case of FIG. 25, the gate electrode 20 having the first gate electrode 20A and the second gate electrode 20B is also provided at a portion where the diffusion layer 24 is present.

The semiconductor device shown in FIGS. 25 and 26 can be formed by first depositing the material of the second gate electrode 20B, selectively etching back a part of the deposited material, and then depositing the material of the first gate electrode 20A. The second gate electrode 20B which is a portion formed on the collector side of the gate electrode 20 is configured to have a smaller impurity concentration than the first gate electrode 20A. This can be rephrased by the impurity concentration of the gate electrode 20 in contact with the carrier store layer 32 and the substrate 30 via the gate insulating film 22 being set to a low concentration. As a result, a potential distribution occurs in the second gate electrode 20D, and the displacement current is reduced. Therefore, the potential variation of the gate electrode 20 beside a portion where a channel is formed is reduced, which enables suppression of increase of the short-circuit current, a recovery current under low-current turn-on, etc. which are caused by lift-up of the gate potential.

Fifth Embodiment

Figure 27:
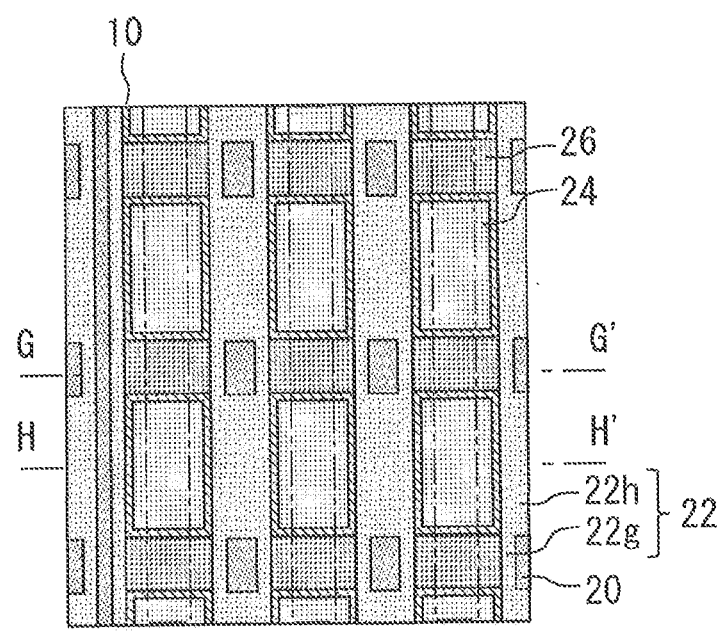
FIG. 27 is a plan view of a semiconductor device according to a fifth embodiment.

FIG. 27 is a plan view of a semiconductor device according to a fifth embodiment. The gate electrode 20 is formed only beside the emitter layer 26 in plan view. The gate electrode 20 is not formed beside the diffusion layer 24. In plan view, a plurality of island-shaped gate electrodes 20 are formed. The second gate insulating film 22h beside the diffusion layer 24 is formed to be thicker than the first gate insulating film 22g beside the emitter layer 26. As a result, the gate electrode 20 is provided only beside the emitter layer 26 which is a portion where a channel is formed.

Figure 28:
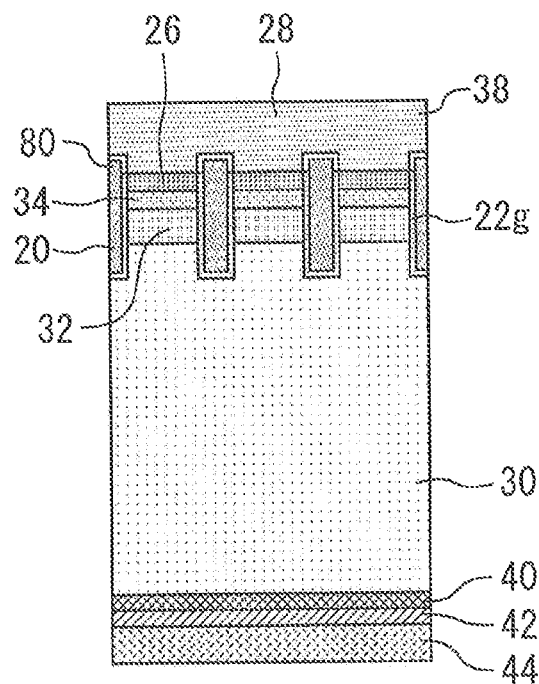
FIG. 28 is a cross-sectional view of the semiconductor device taken along G-G' line of FIG. 27.
Figure 29:
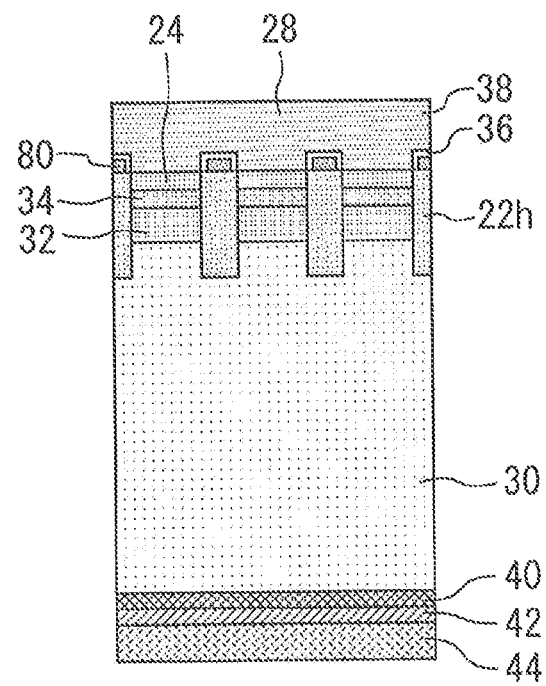
FIG. 29 is a cross-sectional view of the semiconductor device taken along H-H' line of FIG. 27.

FIG. 28 is a cross-sectional view of the semiconductor device taken along G-G' line of FIG. 27. A gate wire 80 is formed on the gate electrode 20. FIG. 29 is a cross-sectional view of the semiconductor device taken along H-H' line of FIG. 27. A gate wire 80 is formed on the second gate insulating film 22h. The gate wire 80 of FIG. 28 and the gate wire 80 of FIG. 29 are connected to each other. The gate electrode 20 and the gate wires 80 are formed of polysilicon, for example.

As described above, the values of Cge and Cgc can be reduced by thickening the gate insulating film in contact with the diffusion layer 24 which is the portion where no channel is formed. As a result, the displacement current occurring in the gate electrode 20 when potential variation occurs around the gate insulating film can be reduced, so that increase of short-circuit current, etc. caused by the lift-up of the gate can be prevented.

Figure 30:
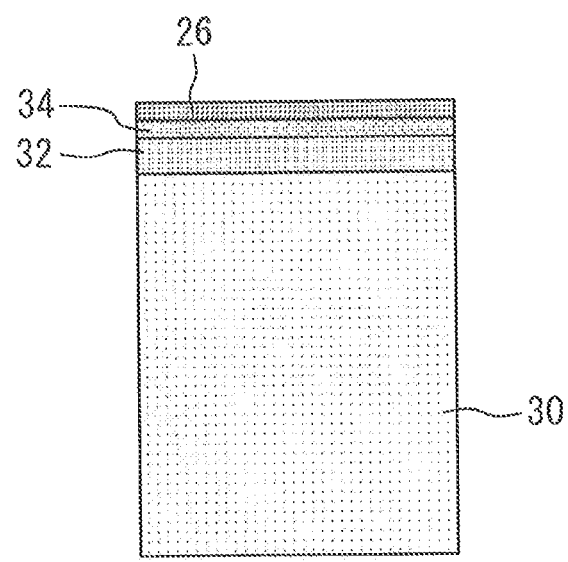
FIG. 30 is a cross-sectional view of a semiconductor device under manufacturing.
Figure 31:
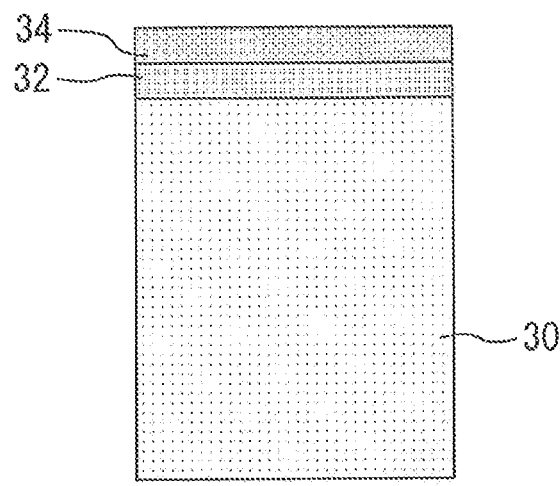
FIG. 31 is a cross-sectional view of a semiconductor device under manufacturing.

A method of manufacturing the semiconductor device according to the fifth embodiment will be described. First, structures shown in FIGS. 30 and 31 are manufactured. FIG. 30 is a cross-sectional view of a semiconductor device at a portion containing the emitter layer 26. FIG. 30 shows a semiconductor device under manufacturing on a cross-section along G-G' line of FIG. 27. FIG. 31 is a cross-sectional view of a portion where the diffusion layer 24 is formed. FIG. 31 shows a semiconductor device under manufacturing on the cross-section along H-H' line of FIG. 27. The carrier store layer 32 is formed on the substrate 30, the channel dope layer 34 is formed on the carrier store layer 32, and the emitter layer 26 is formed partially on the channel dope layer 34. The structures shown in FIGS. 30 and 31 can be obtained as described above.

Figure 32:
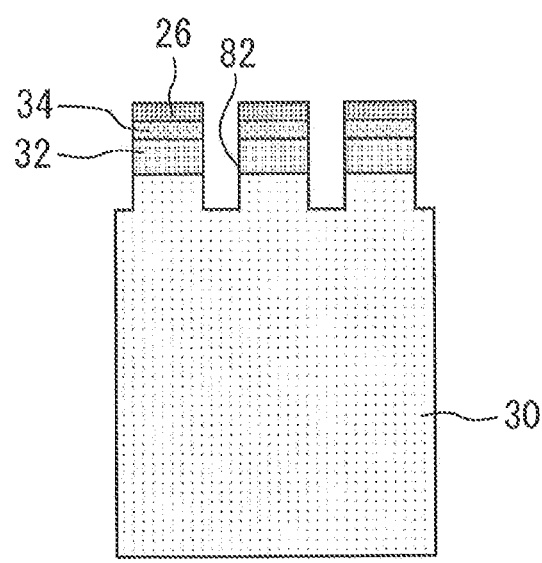
FIG. 32 is a cross-sectional view of a semiconductor device under manufacturing.
Figure 33:
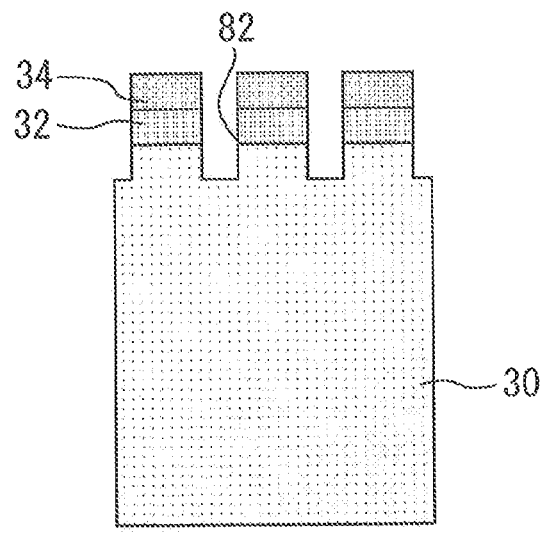
FIG. 33 is a cross-sectional view of a semiconductor device under manufacturing.

Subsequently, trenches for forming a gate insulating film and gate electrodes are formed in the structures shown in FIGS. 30 and 31. Specifically, portions where the emitter layers 26 are formed in plan view and portions where the emitter layer 26 is not formed in plan view are partially etched to form first trenches through which the substrate 30 is exposed. The first trenches 82 are shown in FIGS. 32 and 33. FIG. 32 is a cross-sectional view showing that the first trenches 82 are formed in the structure of FIG. 30. FIG. 33 is a cross-sectional view showing that the first trenches 82 are formed in the structure of FIG. 31. The first trenches 82 can be formed by using the general photoengraving technique and the etching technique.

Figure 34:
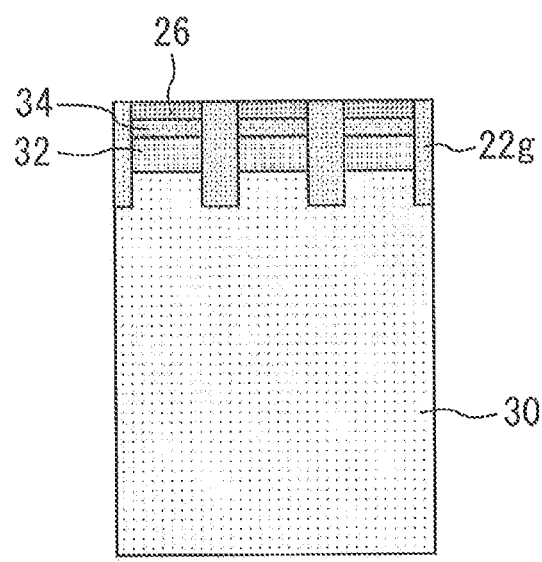
FIG. 34 is a cross-sectional view of a semiconductor device under manufacturing.
Figure 35:
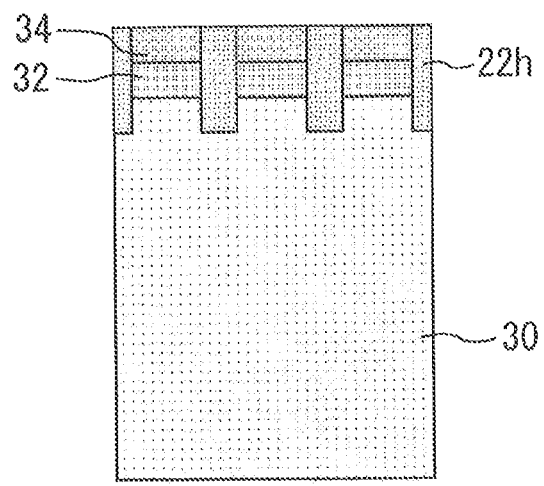
FIG. 35 is a cross-sectional view of a semiconductor device under manufacturing.

Subsequently, the first trenches 82 are embedded with a gate insulating film. For example, after an oxide film is deposited, a surplus oxide film is removed by etching to form the gate insulating film in the first trenches 82. FIG. 34 is a cross-sectional view showing that first gate insulating films 22g are formed in the first trenches 82 of the structure of FIG. 32. FIG. 35 is a cross-sectional view showing that second gate insulating films 22h are formed in the first trenches 82 of the structure of FIG. 33.

Figure 36:
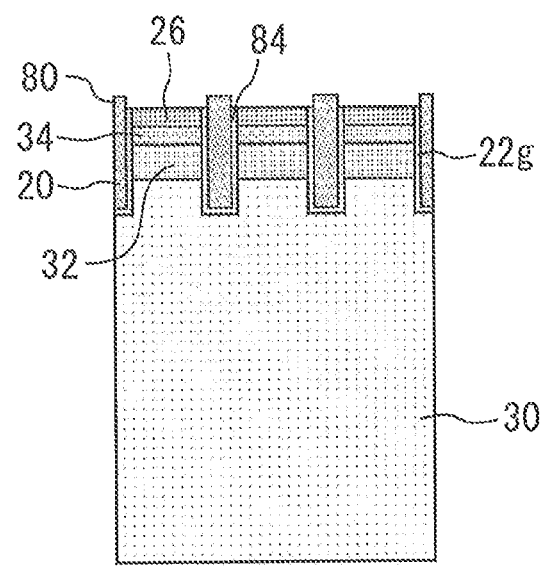
FIG. 36 is a cross-sectional view of a semiconductor device under manufacturing.

Subsequently, second trenches are formed in the first gate insulating films 22g shown in FIG. 34. The second trenches are embedded with gate electrodes. FIG. 36 shows that the second trenches 84 are formed in the structure of FIG. 34 and the second trenches 84 are embedded with the gate electrodes 20. The second trench 84 is formed by etching a part of the first gate insulating film 22g beside the emitter layer 26 in plan view so that the emitter layer 26, the channel dope layer 34, the carrier store layer 32 and the substrate 30 are not exposed. This process can be performed by using the general photoengraving technique and the etching technique. As a result, the first gate insulating film 22g which is U-shaped in cross-sectional view is formed. The second trench 84 is provided by the first gate insulating film 22g which is formed to be U-shaped in cross-sectional view. The gate electrode 20 is formed, for example, of a polysilicon in the second trench 84.

Figure 37:
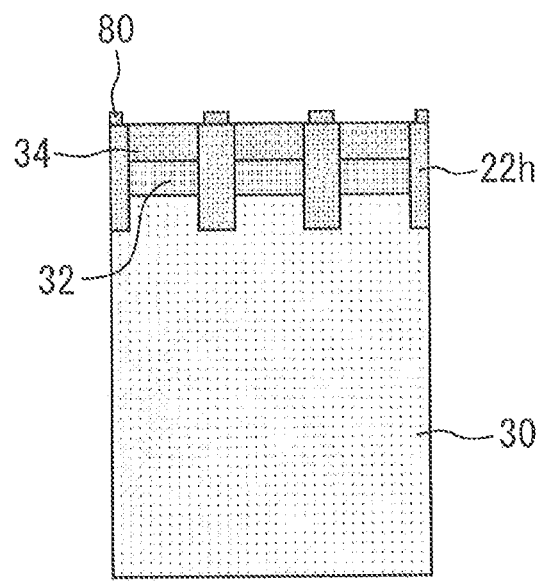
FIG. 37 is a cross-sectional view of a semiconductor device under manufacturing.

The gate wire 80 is formed on the gate electrode 20 simultaneously with or with a delay from the formation of the gate electrode 20. As shown in FIG. 37, the gate wire 80 is also formed on the second gate insulating film 22h. The gate wire 80 is formed beside the emitter layer 26 and beside a portion where the emitter layer 26 is not formed in plan view, whereby the gate electrodes 20 adjacent to the two emitter layers 26 provided with the diffusion layer 24 interposed therebetween can be electrically connected to each other. By using the deposition technique, the photoengraving technique and the etching technique, the second trenches 84, the gate electrodes 20, and the gate wires 80 can be formed. Thereafter, the semiconductor device shown in FIGS. 27 to 29 can be manufactured by executing a well-known process.

Sixth Embodiment

Figure 38:
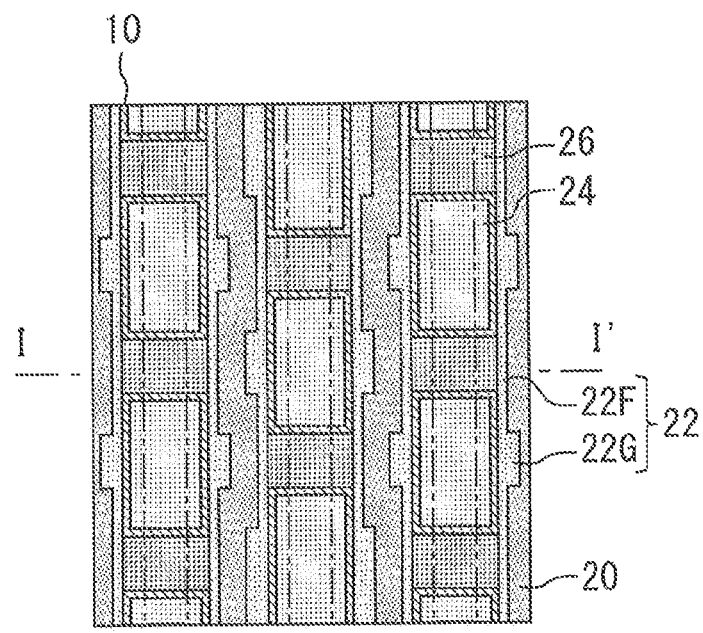
FIG. 38 is a plan view of a semiconductor device according to a sixth embodiment.

FIG. 38 is a plan view of a semiconductor device according to a sixth embodiment. Plural emitter layers 26 are provided in a staggered arrangement in plan view, and plural diffusion layers 24 are provided in a staggered arrangement in plan view. The emitter layers 26 and the diffusion layers 24 are arranged in a staggered form with respect to the gate electrodes 20 extending in parallel. The gate insulating film 22 has a first gate insulating film 22F in contact with the emitter layer 26 and a second gate insulating film 22G in contact with the diffusion layer 24. At least a part of the second gate insulating film 22G is formed to be thicker than the first gate insulating film 22F.

Figure 39:
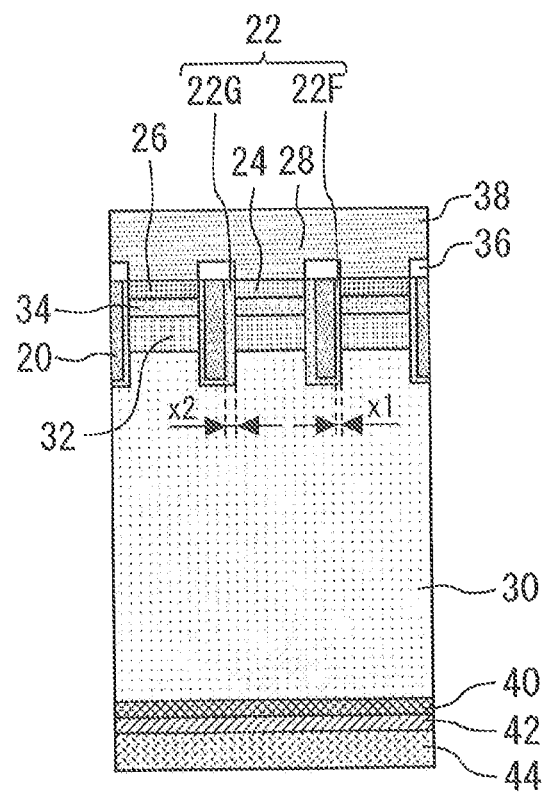
FIG. 39 is a cross-sectional view taken along I-I' line of FIG. 38.

FIG. 39 is a cross-sectional view taken along I-I' line of FIG. 38. The thickness x2 of the second gate insulating film 22G is larger than the thickness x1 of the first gate insulating film 22F. That is, the gate insulating film in contact with the diffusion layer 24 where no channel is formed is configured to be thicker than the gate insulating film in contact with the emitter layer 26 where a channel is formed, so that the values of Cge and Cgc can be reduced. Therefore, the displacement current of the gate electrode when potential variation occurs around the gate insulating film is reduced, so that increase of short-circuit current, etc. caused by lift-up of the gate can be prevented.

The semiconductor device according to the sixth embodiment can be manufactured by using the method of forming a bellows-shaped pattern to provide a difference in thickness of the oxide film as in the case of the method of manufacturing the semiconductor device according to the third embodiment.

The semiconductor devices according to the third, fifth and sixth embodiments are common to one another in that at least a part of the gate insulating film in contact with the diffusion layer 24 is made thicker than the gate insulating film in contact with the emitter layer 26. This feature may be incorporated into other embodiments.

The effect of the present invention can be enhanced by combining the features of the semiconductor devices described in the first to sixth embodiments. The structure of some embodiment may be adopted in some region of a semiconductor device while the structure of another embodiment may be adopted in another region of the semiconductor device. The foregoing structures may be adopted partially. Furthermore, the structure of the semiconductor device is not limited to IGBT, but may be applied to a power device such as a MOSFET or a diode. The withstand voltage class of the semiconductor device is not limited to a specific one. An FZ substrate, an epitaxial substrate or a well-known substrate may be used as the substrate 30.

Seventh Embodiment

In this embodiment, the semiconductor devices according to the foregoing first to sixth embodiments are applied to a power conversion device. The present invention is not limited to a specific power conversion device, and a case where the present invention is applied to a three-phase inverter will be described as a seventh embodiment.

Figure 40:
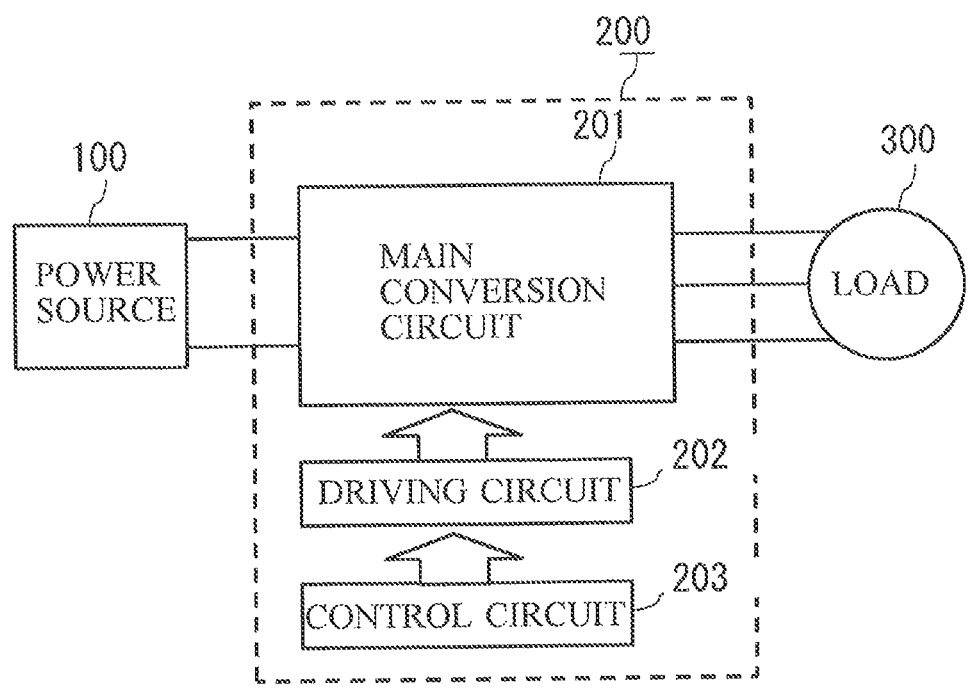
FIG. 40 is a block diagram showing the configuration of a power conversion system according to seventh embodiment.

FIG. 40 is a block diagram showing the configuration of a power conversion system to which a power conversion device according to this embodiment is applied.

The power conversion system shown in FIG. 40 includes a power source 100, a power conversion device 200 and a load 300. The power source 100 is a DC power source, and supplies DC power to the power conversion device 200. The power source 100 may be configured by various kinds of devices, and for example, it may be configured by a DC system, a solar battery or a storage battery, or configured by a rectifying circuit or an AC/DC converter which is connected to an AC system. Furthermore, the power source 100 may be configured by a DC/DC converter for converting DC power output from a DC system to predetermined power.

The power conversion device 200 is a three-phase inverter connected between the power source 100 and the load 300, converts DC power supplied from the power source 100 to AC power and supplies the AC power to the load 300. As shown in FIG. 40, the power conversion device 200 includes a main conversion circuit 201 for converting DC power to AC power and outputting the AC power, a driving circuit 202 for outputting a driving signal for driving each switching device of the main conversion circuit 201, and a control circuit 203 for outputting, to the driving circuit 202, a control signal for controlling the driving circuit 202.

The load 300 is a three-phase electric motor to be driven with AC power supplied from the power conversion device 200. The load 300 is not limited to a specific purpose, and it is an electric motor to be mounted in various kinds of electric equipment. For example, it is used as an electric motor suitable for a hybrid car, an electric car, a rolling stock, an elevator or an air conditioner.

The power conversion device 200 will be described hereunder in detail. The main conversion circuit 201 has a switching device and a reflux diode (not shown). Upon switching of the switching device, the power conversion device 200 converts DC power supplied from the power source 100 to AC power, and supplies the AC power to the load 300. There are various specific circuit configurations for the main conversion circuit 201. The main conversion circuit 201 according to this embodiment is a 2-level three-phase full-bridge circuit, and may be configured by six switching devices and six reflux diodes which are connected in inverse-parallel to the respective switching devices. The semiconductor device according to any one of the first to sixth embodiments described above is applied to each switching device of the main conversion circuit 201. Every two switching devices of the six switching devices constitute a pair of upper and lower arms which are connected in series, and each pair of the upper and lower arms constitutes each phase (U-phase, V-phase, W-phase) of the full-bridge circuit. The output terminals of the respective pairs of upper and lower arms, that is, three output terminals of the main conversion circuit 201 are connected to the load 300.

The driving circuit 202 generates a driving signal for driving the switching devices of the main conversion circuit 201, and supplies the driving signal to control electrodes of the switching devices of the main conversion circuit 201. Specifically, a driving signal for setting the switching device to ON-state and a driving signal for setting the switching device to OFF-state are output to the control electrodes of the respective switching devices according to the control signal from the control circuit 203 described later. When the switching device is kept to the ON-state, the driving signal is a voltage signal (ON signal) which is not less than a threshold voltage of the switching device, and when the switching device is kept to the OFF-state, the driving signal is a voltage signal (OFF signal) which is not more than the threshold voltage of the switching device.

The control circuit 203 controls the switching devices of the main conversion circuit 201 so that desired power is supplied to the load 300. Specifically, a time (ON time) for which each switching device of the main conversion circuit 201 is to be set to the ON-state is calculated based on power to be supplied to the load 300. For example, the main conversion circuit 201 can be controlled by PWM control for modulating the ON-time of the switching devices according to a voltage to be output. A control command (control signal) is output to the driving circuit 202 so that at each time point, the ON signal is output to switching devices to set the switching devices to the ON-state while the OFF signal is output to switching devices to set the switching devices to the OFF-state. The driving circuit 202 outputs the ON signal or OFF signal as a driving signal to the control electrode of each switching device according to the control signal.

In the power conversion device according to this embodiment, since the semiconductor device according to any one of the first to sixth embodiments is applied as the switching devices of the main conversion circuit 201, a malfunction caused by a displacement current flowing in the gate electrode can be prevented. That is, reliability of the power conversion device can be enhanced.

This embodiment is described by using an example in which the present invention is applied to the 2-level three-phase inverter. However, the present invention is not limited to this example, and the present invention is applicable to various power conversion devices. In this embodiment, the 2-level power conversion device is used, but 3-level or multi-level power conversion device may be used, and the present invention may be applied to a single-phase inverter when power is supplied to a single-phase load. When power is supplied to a DC load or the like, the present invention may be applied to a DC/DC converter or an AC/DC converter.

The power conversion device to which the present invention is applied is not limited to a case where the load described above is an electric motor, and for example, it may be used as a power supply device for an electric discharge machine, a laser beam machine, an induction heating cooker, or a contactless equipment power supply system, and further may be used as a power conditioner for a photovoltaic power generation system, a power storage system or the like.

According to the present invention, the displacement current flowing in the gate electrode can be suppressed, for example by increasing the thickness of the gate insulating film in contact with the carrier store layer.

The invention claimed is:

1. A semiconductor device comprising:
a first conductivity type substrate;
a first conductivity type carrier store layer formed on an upper surface side of the substrate;
a second conductivity type channel dope layer formed on the carrier store layer;
a first conductivity type emitter layer formed on the channel dope layer;
an emitter electrode provided on and electrically connected to the emitter layer;
a gate electrode in contact with the emitter layer, the channel dope layer, and the carrier store layer via a gate insulating film;
a conductor layer in contact with the carrier store layer and the substrate via an isolation insulating film;
a separation insulating film that covers a lower surface of the gate electrode and covers an upper surface of the conductor layer to thereby electrically separate the conductor layer and the gate electrode from each other; and
a second conductivity type collector layer formed on a lower surface side of the substrate, wherein
the conductor layer is wholly covered by the isolation insulating film and the separation insulating film so that the conductor layer is electrically insulated from the emitter electrode and the gate electrode,
a lower end of the conductor layer contacts the substrate via the isolation insulating film, and
the conductor layer extends from the carrier store layer into the substrate.

2. The semiconductor device according to claim 1, wherein
the conductor layer contacts the substrate only through the isolation insulating film.

3. A semiconductor device comprising:
a first conductivity type substrate;
a first conductivity type carrier store layer formed on an upper surface side of the substrate;
a second conductivity type channel dope layer formed on the carrier store layer;
a first conductivity type emitter layer formed on the channel dope layer;
an emitter electrode provided on and electrically connected to the emitter layer;
a gate electrode in contact with the emitter layer, the channel dope layer, and the carrier store layer via a gate insulating film;
a conductor layer in contact with the carrier store layer and the substrate via an isolation insulating film, the conductor layer having an electrically floated potential;
a separation insulating film that covers a lower surface of the gate electrode and covers an upper surface of the conductor layer to thereby electrically separate the conductor layer and the gate electrode from each other; and
a second conductivity type collector layer formed on a lower surface side of the substrate, wherein
the conductor layer is electrically insulated from the emitter electrode and the gate electrode,
a lower end of the conductor layer contacts the substrate via the isolation insulating film, and
the conductor layer extends from the carrier store layer into the substrate.

4. The semiconductor device according to claim 3, wherein
the conductor layer contacts the substrate only through the isolation insulating film.

* * * * *